United States Patent
West (10) Patent No.: US 7,248,093 B2
(45) Date of Patent: Jul. 24, 2007

(54) BIPOLAR BOOTSTRAP TOP SWITCH GATE DRIVE FOR HALF-BRIDGE SEMICONDUCTOR POWER TOPOLOGIES

(75) Inventor: Rick West, Pismo Beach, CA (US)

(73) Assignee: Distributed Power, Inc., San Luis Obispo, CA (US)

( * ) Notice: Subject to any disclaimer, the term of this patent is extended or adjusted under 35 U.S.C. 154(b) by 434 days.

(21) Appl. No.: 10/710,958

(22) Filed: Aug. 14, 2004

(65) Prior Publication Data

US 2006/0034107 A1 Feb. 16, 2006

(51) Int. Cl.
*H03K 17/16* (2006.01)
(52) U.S. Cl. ...................................... 327/390; 327/424
(58) Field of Classification Search .................. 326/88; 327/110, 112, 390, 423, 424, 434, 437
See application file for complete search history.

(56) References Cited

U.S. PATENT DOCUMENTS 5,218,523 A * 6/1993 Sugishima .................. 363/132
5,969,964 A * 10/1999 Mangtani .................... 363/132
6,353,345 B1 * 3/2002 Yushan et al. .............. 327/112
7,046,040 B2 * 5/2006 Guedon ....................... 326/88

* cited by examiner

*Primary Examiner*—Jeffrey Zweizig
(74) *Attorney, Agent, or Firm*—Thelen Reid Brown Raysman & Steiner LLP (57) ABSTRACT

The invention is a method and apparatus for supplying both positive and negative gate drive power supply potentials to the top switch, in a typical half-bridge semiconductor power topology, from the bottom switch gate drive power supplies and without the use of transformer, capacitive or optical isolation. A known method of providing the positive top switch gate drive supply is enhanced and used in conjunction with a new and novel method for providing the negative top switch gate drive supply. The negative top switch gate drive supply is provided by an additional, lower power semiconductor switch, which is substantially synchronized with the bottom semiconductor switch, except for a slight turn-on delay. When this additional switch is gated "on" and conducting, the negative bottom switch gate drive power is connected to the negative top switch gate drive supply energy storage capacitors.

9 Claims, 8 Drawing Sheets

BIPOLAR BOOTSTRAP TOP SWITCH GATE DRIVE FOR HALF-BRIDGE SEMICONDUCTOR POWER TOPOLOGIES

Figure 3:
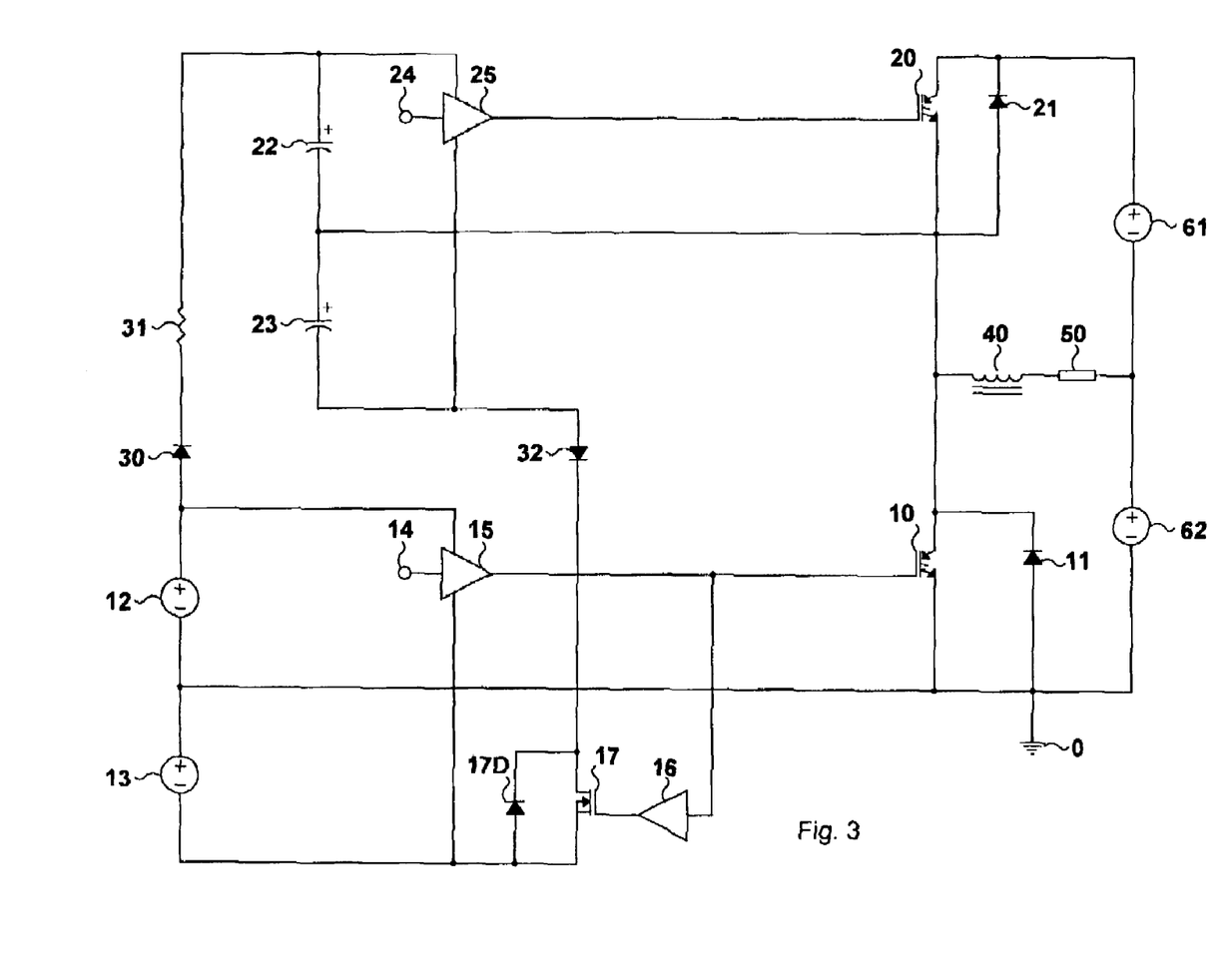
FIG. 3 is a simplified electrical schematic diagram of the preferred embodiment of the invention when used as part of a typical half-bridge topology DC to AC power converter.

FIG. 3 illustrates the preferred embodiment of the invention used as part of a DC. to AC power converter. In this example, the power converter comprises DC power sources 61 and 62, AC load 50 and filter inductor 40. IGBT 10 is designated the "bottom switch", and IGBT 20 is designated the "top switch" in a typical half-bridge power circuit topology. Anti-parallel or "free-wheeling" diodes 11 and 21 are also typical of a half-bridge topology. Ground reference 0 is arbitrary and used to simplify the following discussion. The basic, half-bridge circuit power circuit topology is known, as are the regulation and control methods thereof. Power supply 12 is positive with respect to the emitter of IGBT 10 and is typically in the order of +15 vdc to +18 vdc. Power supply 13 is negative with respect to the emitter of IGBT 10 and is typically in the order of −5 vdc to −15 vdc. Gate driver 15 drives the gate voltage, with respect to the emitter, on IGBT 10 between the power supply 12 and 13 potentials. In a similar way, gate driver 25 drives the gate voltage, with respect to the emitter, on IGBT 20 between the positive voltage on capacitor 22 and the negative voltage on capacitor 23. Gate drive inputs 14 and 24 for gate drivers 15 and 25, respectively are from a control circuit not related to this invention as regulation and control methods for half-bridge DC to AC converters are known. Pertinent to this discussion are certain characteristics of these signals that are substantially universal to a half-bridge topology. Specifically, gate drive inputs 14 and 24 command only one IGBT, either IGBT 10 or IGBT 20, on at the same time. When the DC to AC converter is running, IGBT 10 and IGBT 20 operate substantially in complement, one "on" one "off" and with a short "dead time" at switching transitions when neither IGBT is on. This "dead time" prevents any momentary overlap or cross-conduction and short-circuiting of DC sources 61 and 62. Assuming initial conditions with no charge on either capacitor 22 or 23, gate drive input 14 commands gate drive 15 to bring the gate voltage on IGBT 10 to the potential of positive power supply 12. After a brief, typically sub-microsecond turn-on delay, an intrinsic characteristic of IGBT devices, IGBT 10 is in full conduction. In the power circuit, current is sourced from DC source 62 and flows through load 50 and inductor 40. With respect to ground reference 0, the voltage at the common point of capacitors 22, 23 and the emitter of top IGBT 20 is clamped to the collector to emitter conduction voltage drop across bottom IGBT 10. The output of gate driver 15 is also connected to the input of FET driver 16. FET driver 16 has an intentional, preprogrammed turn-on delay to insure that FET 17 is not brought into conduction before IGBT 10 is in full conduction. Positive top gate drive supply capacitor 22 has two possible charge current paths, depending on the relative charges on capacitors 22 and 23, comprising; (i) power supply 12, bootstrap diode 30, current limiting resistor 31, capacitor 22, capacitor 23, blocking diode 32, FET 17 and power supply 13 and (ii) power supply 12, bootstrap diode 30, current limiting resistor 31, capacitor 22 and IGBT 10. Negativetop gate drive supply capacitor 23 also has two possible charge current paths, again depending on the relative charges on capacitors 22 and 23; (i) power supply 13, power supply 12, bootstrap diode 30, current limiting resistor 31, capacitor 22, capacitor 23, blocking diode 32 and FET 17 and (ii)power supply 13, IGBT 10, capacitor 23, blocking diode 32 and FET 17. It must be noted that, in this last scenario, the net current flow thru IGBT 10 is always in the direction of forward conduction as current through IGBT 10 is sourced from DC power source 62. The net effect of the last charge path described is a reduction in the current through IGBT 10 equal to the charging current out of capacitor 13 and into capacitor 23. If IGBT 10 remained in conduction long enough for capacitors 22 and 23 to fully charge, capacitor 22 would charge a absolute value equal to the voltage of power supply 12 minus the forward drop across bootstrap diode 30 minus the conduction drop across IGBT 10 and the voltage on capacitor 23 would charge to an absolute value equal to the voltage of power supply 13 minus forward drop across blocking diode 32 plus the conduction drop across IGBT 10. In order to prevent high currents from flowing in the drive circuit power supplies, resistor 31 and the "on" resistance of FET 17 are used to limit current. As a result, the time constants formed with resistor 31 and capacitor 22 and also FET 17 drain to sourceresistance and capacitor 23 are typically long compared with the switching frequency of IGBT 10. As such, a number of IGBT 10 switching cycles are required to completely charge capacitors 22 and 23. In the next alternate half cycle when IGBT 10 is gated "off" and IGBT 20 is gated "on" there may not be enough voltage on capacitor 22 to bring IGBT 20 into full conduction nor may there be enough voltage on capacitor 23 to insure an oscillation free turn-off of IGBT 20. Both gate drivers 25 and 15 include undervoltage lockout circuits with voltage hysteresis that inhibit IGBT "on" drive until both positive and negative drive supplies for a given IGBT exceed preset thresholds.

Figure 4:
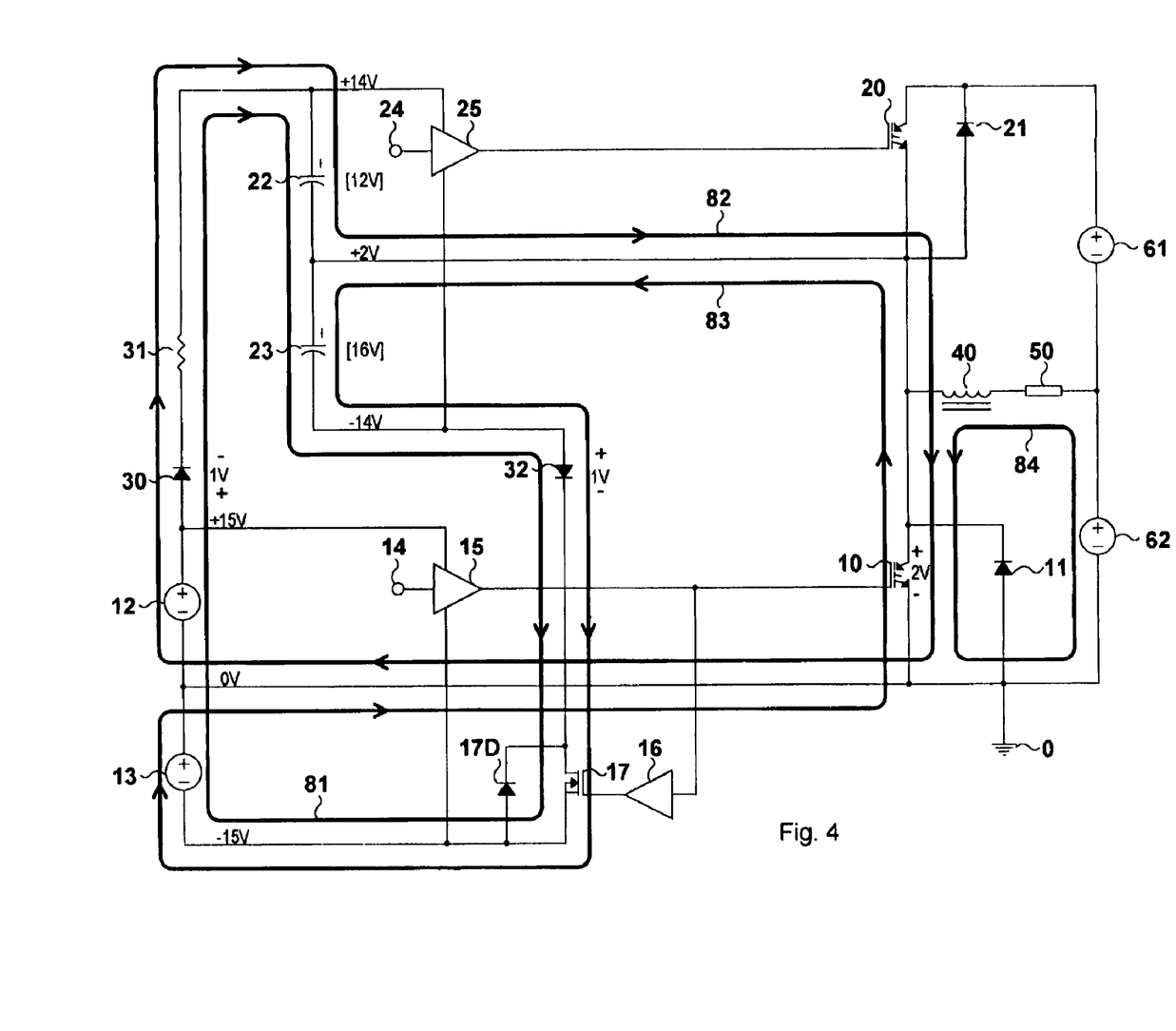
FIG. 4 illustrates the current paths and voltage drops of the drive circuit power supplies when the bottom switch of a typical half-bridge topology is in conduction.

FIG. 4 illustrates the charge current paths and the voltage drops around the around the two current paths described in the previous paragraph where IGBT 10 is in forward conduction and when capacitor 22 and 23 are very close to full charge. For simplicity, all diode forward voltage drops are arbitrarily chosen to be static at 1.0 volts and the forward conduction drop or saturation voltage of IGBT 10 is chosen to be static at 2.0 volts. The net current through IGBT 10 is in the direction of forward conduction and sustains the 2.0 volt "clamp" at the emitter of IGBT 10. Power supplies 12 and 13 are arbitrarily chosen to be +15 vdc and −15 vdc with respect to ground reference 0. Charge path 81 or 82 will cause the top drive supply capacitor 22 to be charged to approximately 12 vdc. Charge path 81 or 83 will cause bottom drive supply capacitor 23 to be charged to approximately 16 vdc. Current path 84 shows the contribution of the load current keeping IGBT 10 in saturation.

Again referring to FIG. 3, a less obvious but functionally significant charge path for capacitors 22 and 23 is described. When IGBT 10 is gated "on" and free-wheeling diode 11 is in conduction and providing a current path for stored energy in inductor 40, a common condition in DC to AC converters using a half-bridge topology, the voltage at the common point of capacitors 22, 23 and the emitter of top IGBT 20, is clamped below ground reference 0 by an amount equal to the forward drop across freewheeling diode 11. Negativetop gate drive supply capacitor 23 has two possible charge current paths, depending on the relative charges on capacitors 22 and 23; (i) power supply 13, power supply 12, bootstrap diode 30, current limiting resistor 31, capacitor 22, capacitor 23, blocking diode 32 and FET 17 and (ii)power supply 13, freewheeling diode 11, capacitor 23, blocking diode 32 and FET 17. Positive top gate drive supply capacitor 22 also has two possible charge current paths, again depending on the relative charges on capacitors 22 and 23, comprising; (i) power supply 12, bootstrap diode 30, current limiting resistor 31, capacitor 22, capacitor 23, blocking diode 32, FET 17 and power supply 13 and (ii) power supply 12, bootstrap diode 30, current limiting resistor 31, capacitor 22 and freewheeling diode 11. It must be noted that, in this last scenario, the net current flow through freewheeling diode 11 is always in the direction of forward conduction as current through freewheeling diode 11 provides a path for the stored energy in inductor 40. The net effect of the last charge path described is a reduction in the freewheeling diode 11 current equal to the charging current out of capacitor 12 and into capacitor 22.

Figure 5:
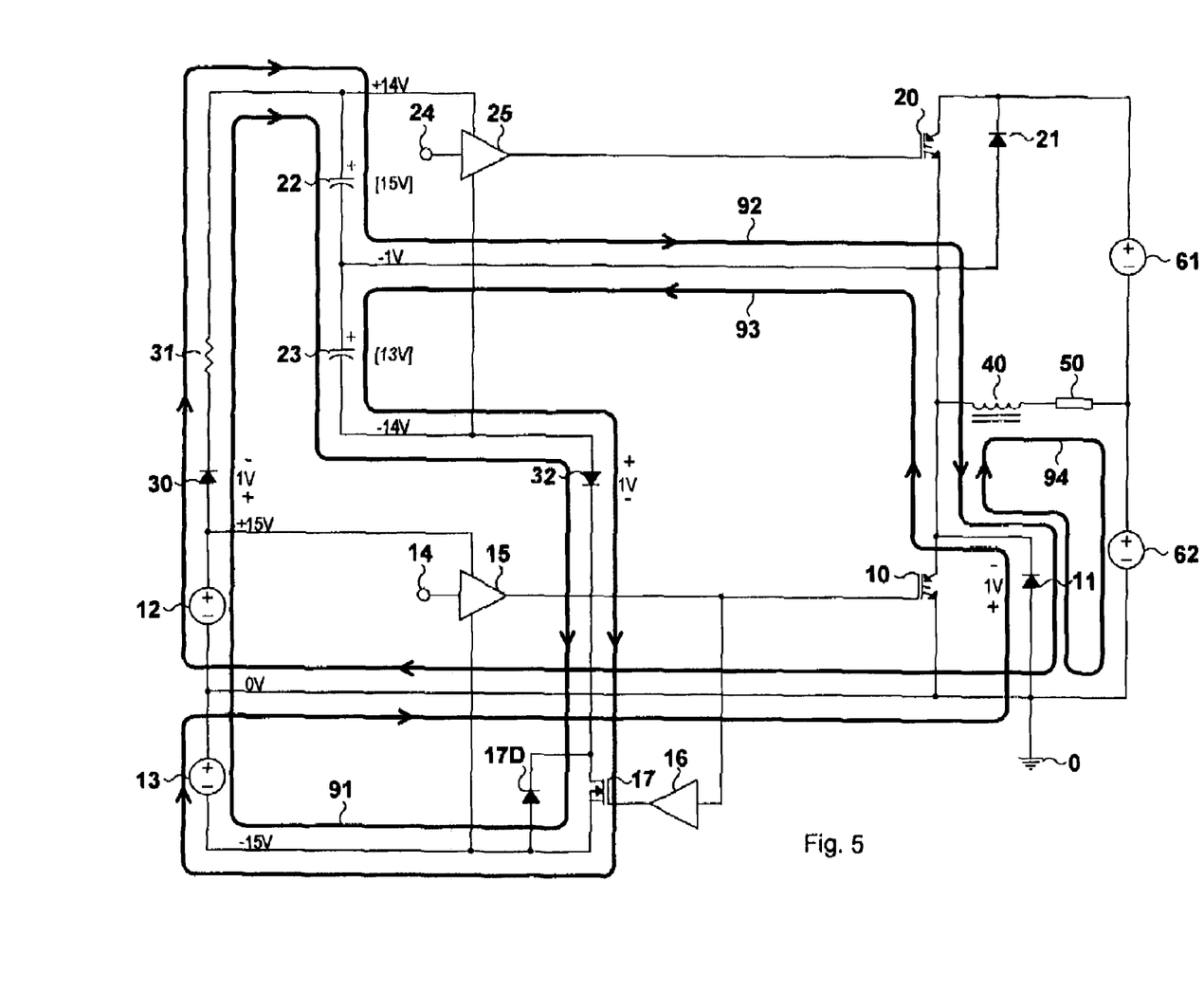
FIG. 5 illustrates the current paths and voltage drops of the drive circuit power supplies when the anti-parallel freewheeling diode associated with the bottom switch of a typical half-bridge topology is in conduction.

FIG. 5 illustrates the charge current paths and the voltage drops around the around the two current paths described in the previous paragraph where freewheeling diode 11 is in forward conduction and when capacitors 22 and 23 are very close to full charge. Again, for simplicity, diode forward voltage drops are arbitrarily chosen to be static at 1.0 volts and the forward conduction drop or saturation voltage of IGBT 10 is chosen to be static at 2.0 volts. Power supplies 12 and 13 are arbitrarily chosen to be +15 vdc and −15 vdc with respect to ground reference 0. Charge path 91 or 92 will cause the top drive supply capacitor 22 to be charged to approximately 15 vdc. Charge path 91 or 93 will cause bottom drive supply capacitor 23 to be charged to approximately 13 vdc. Current path 94 shows the contribution of the inductor current keeping freewheeling diode 11 in forward conduction.

Blocking diode 32 prevents the 16 vdc potential acquired by top drive supply capacitor 23, in the FIG. 4 charge path scenario where IGBT 10 is in conduction, from being discharged by a few volts via a path provided by parasitic FET anti-parallel diode 17D when freewheeling diode 11 begins to conduct. Although not required, blocking diode 32 prevents a relatively high current, back and forth charge transfer between power supply 13 and capacitor 23 and provides for a drive circuit with lower losses and higher continuous voltage potentials on capacitor 23.

In the typical operation of a half-bridge, DC to AC converter, all charge paths illustrated in FIGS. 4 and 5 are in play a number of times during the period of the AC waveform applied to load 50. Overall, the invention provides a means of effectively "bootstrapping" both the positive and negative power supplies from the bottom switch drive to the top switch drive and with substantially equal or slightly greater voltage potentials. The prior art method of bootstrapping the positive top switch power supply is enhance because an additional charging path is provided. A new, novel method provides the negative top switch power supply.

Figure 6:
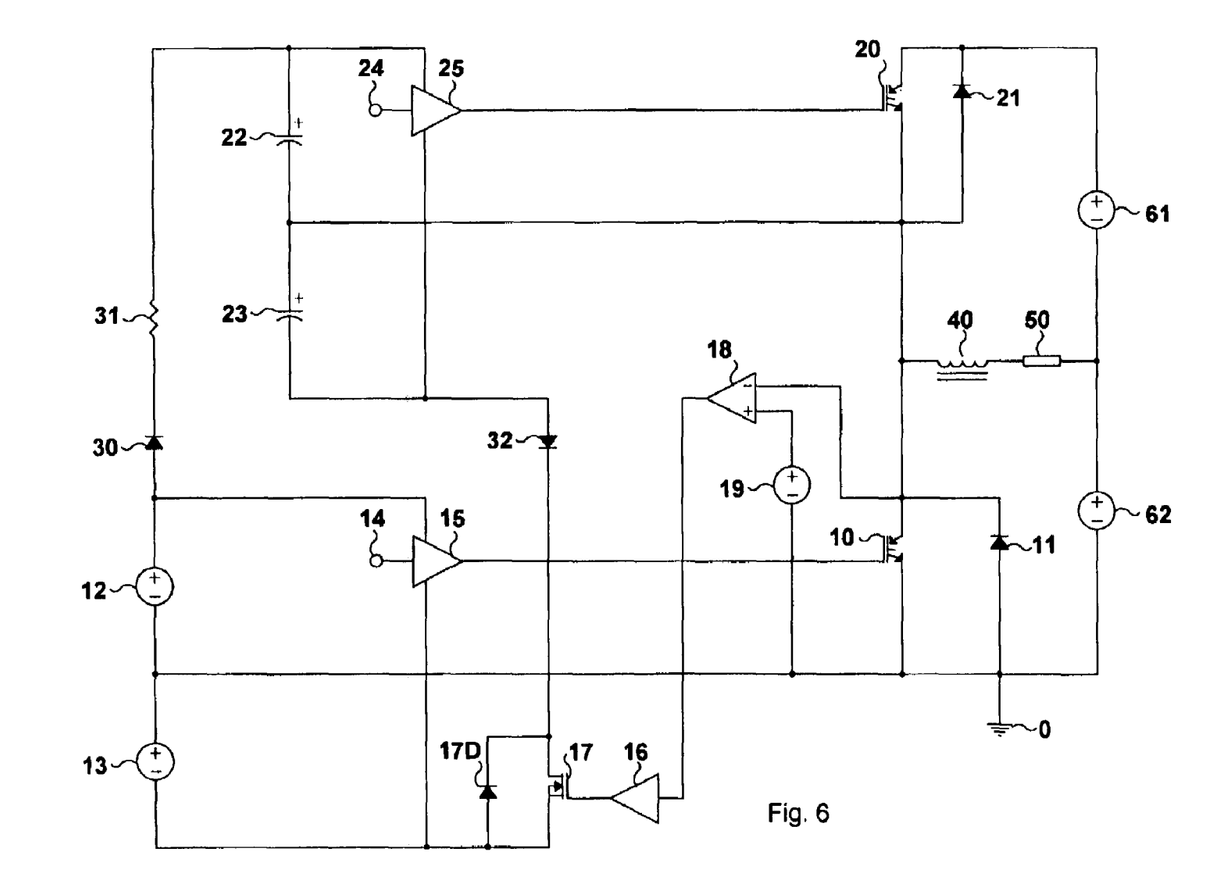
FIG. 6 is an alternate version of the simplified schematic given in FIG. 3 illustrating an alternate method of driving the negative bootstrap switch as a function of the bottom switch collector to emitter voltage and the bottom freewheeling diode cathode to anode voltage.

FIG. 6 illustrates an alternate method for controlling FET 17. All FIG. 3 reference designators are consistent with FIG. 6 reference designators. In this alternate method, comparator 18 has a positive input connected to positive voltage reference 19 and a negative input connected to the collector of bottom IGBT 10. The reference voltage is set just above the highest expected, collector to emitter, saturation voltage of IGBT 10. Therefore when IGBT 10 is brought into full conduction, the output of comparator 18 goes high, in turn the output of driver 16 goes high, with or without a turn-on delay, and in turn FET 17 is brought into conduction. Comparator 18 will also, by design, go to a high state when freewheeling diode 11 is in conduction. All other circuit functions remain the same as the circuit previously described in FIG. 3.

Figure 7:
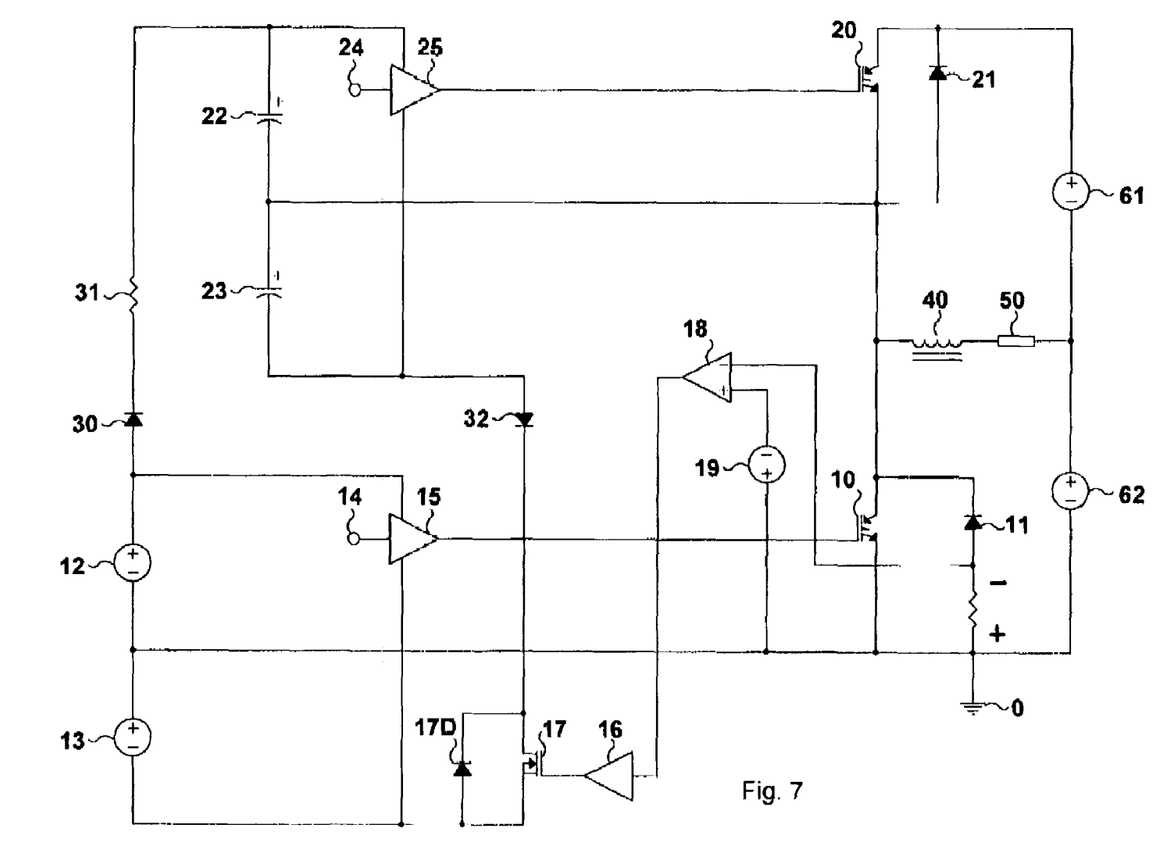
FIG. 7 is an alternate version of the simplified schematic given in FIG. 3 illustrating an alternate method of driving the negative bootstrap switch as a function of current in the bottom freewheeling diode.

FIG. 7 illustrates an alternate method for controlling FET 17. All FIG. 3 reference designators are consistent with FIG. 7 reference designators. In this alternate method, comparator 18 has a positive input connected to minus voltage reference 19 and a negative input connected to a device for sensing current in anti-parallel diode 11. Therefore when diode 11 is freewheeling and providing a path for current through inductor 40, the output of comparator 18 goes high. In turn, the output of driver 16 goes high, with or without a turn-on delay, and in turn FET 17 is brought into conduction. All other circuit functions remain the same as the circuit previously described in FIG. 3.

Figure 8:
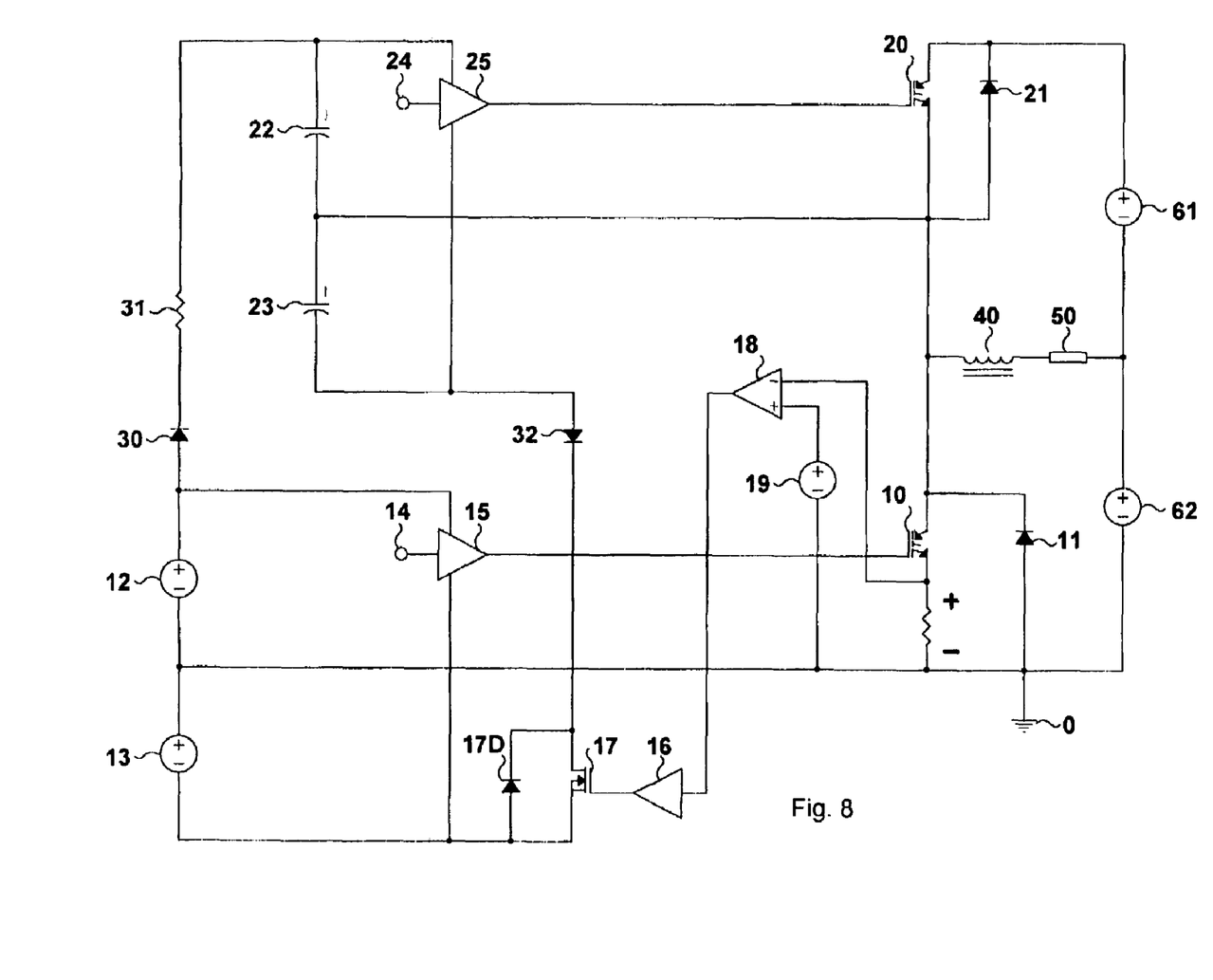
FIG. 8 is an alternate version of the simplified schematic given in FIG. 3 illustrating an alternate method of driving the negative bootstrap switch as a function of the current in the bottom switch.

FIG. 8 illustrates an alternate method for controlling FET 17. All FIG. 3 reference designators are consistent with FIG. 8 reference designators. In this alternate method, comparator 18 has a negative input connected to positive voltage reference 19 and a positive input connected to a device for sensing current through bottom IGBT 10. The reference voltage, and therefore the threshold current, is set high enough to protect the circuit from triggering on noise. Therefore, when IGBT 10 is brought into substantial conduction, the output of comparator 18 goes high. In turn, the output of driver 16 goes high, with or without a turn-on delay, and in turn FET 17 is brought into conduction. All other circuit functions remain the same as the circuit previously described in FIG. 3.

BACKGROUND ART

This invention pertains to power electronics, electrical power conversion and switch mode power supplies.

Semiconductor half-bridge power circuit topologies are the fundamental building blocks used in most high power converters. Two half-bridge circuits are used to configure a full-bridge topology and three half-bridge circuits are used to configure a three-phase bridge topology. The semiconductor switches used are typically insulated gate bipolar transistor (IGBT) and field effect transistor (FET) devices.

When a semiconductor power switch is switched off, a mono-polar gate drive places the gate of the semiconductor device at the same voltage potential as the source for FET devices or the emitter for IGBT devices. A bipolar gate drive places the gate of the semiconductor device at a voltage potential that is negative with respect to the source or emitter.

Not all applications require bipolar drive voltages. However, at gate transitions, if the parasitic inductance from the gate driver circuit to the semiconductor die is large enough, the gate voltage will ring or oscillate at the characteristic frequency of the tank circuit created by this parasitic inductance. If the peak excursions of this ringing are greater than the turn-on threshold of that device, the semiconductor switch will oscillate on and off for a number of unintended high frequency cycles. This extra switching manifests in higher switching losses and higher levels of radio frequency emissions. When a bi-polar drive is used, the negative turn-off potential moves the peak excursion of the gate oscillation away from the device turn-on threshold by an amount equal to the negative gate drive voltage. If the negative gate potential is large enough with respect to the amount of parasitic inductance and the speed of the rise and fall times of the gate voltage, the peak excursion of the oscillation will not exceed the device turn-on threshold. Typically, high frequency, switch-mode applications employing a number of paralleled semiconductor dies or devices will require bipolar drives.

In a typical half-bridge topology using IGBT devices, the emitter of the bottom switch, the zero voltage reference point for the IGBT drive circuit, is connected to a stationary −DC bus with respect to earth ground. The voltage at bottom switch collector and the top switch emitter move between the +DC bus voltage and the −DC bus and at very high rates of voltage change with respect to time. In the prior art, bipolar power supply voltages for the non-stationary top switch were typically transformer isolated. In a typical prior art, three-phase DC to AC power converter, four transformer isolated power supplies were required; one for all three half-bridge bottom switch drives and one for each (three) top switch drives. This invention not only reduces the number of bipolar drive supplies required from four to one but also enables an integrated circuit, silicon-only solution for providing top switch bipolar drive supplies.

In this patent disclosure, a preferred embodiment for the invention will be disclosed. Therein, a known but enhanced method of providing the top switch positive gate drive power is disclosed as well as a new and novel method of providing the top switch negative gate drive power. The half-bridge topology, and regulation and control thereof, used to illustrate the use of the invention are known.

Figure 1:
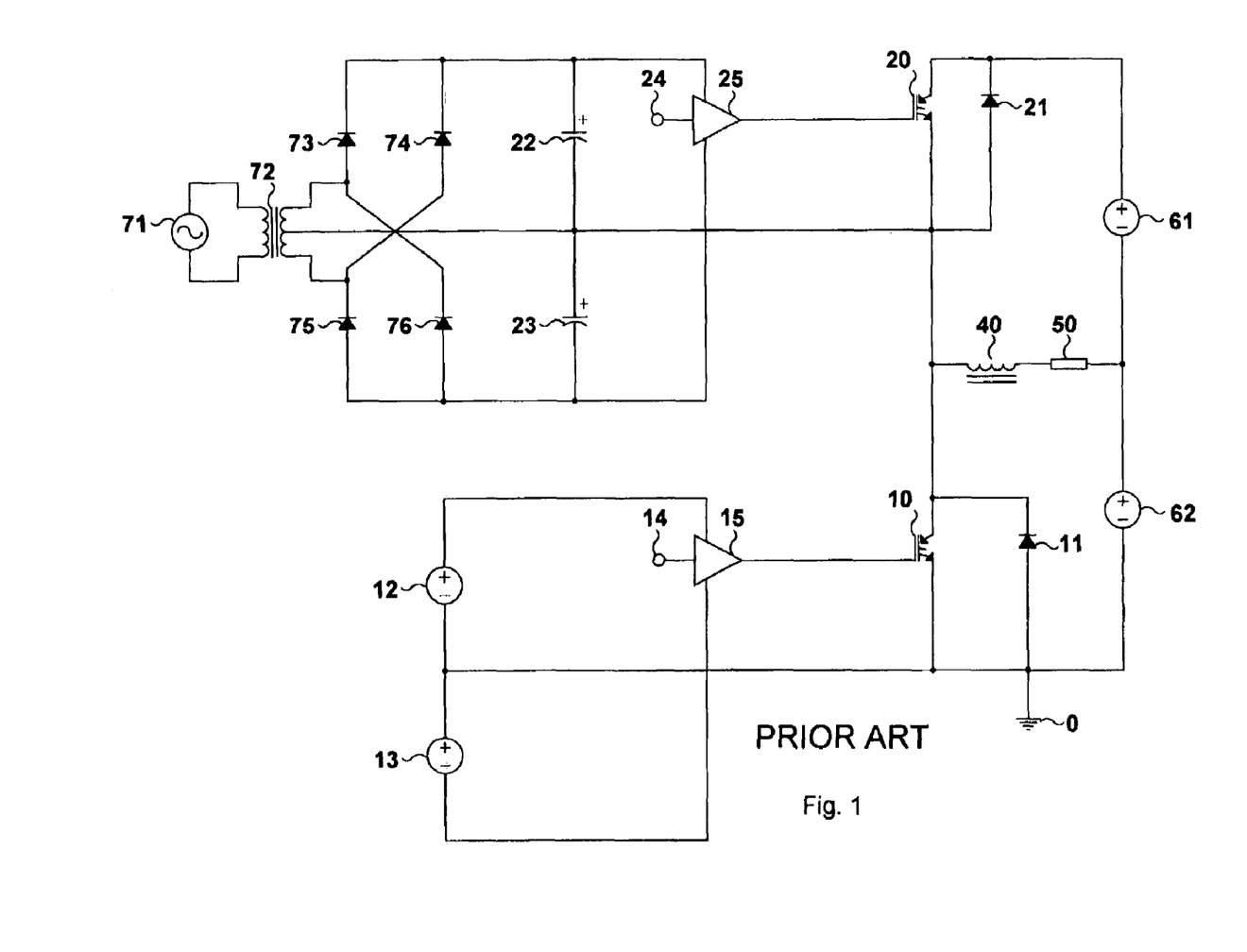
FIG. 1 illustrates a common prior art method of providing bipolar drive supplies to a top or high-side switch using an isolation transformer.

FIG. 1 illustrates one common, prior art method of providing positive and negative drive voltage potentials to the top or high-side semiconductor switch in a half-bridge topology. AC power source 71 is typically 120 volts, 60 Hertz. AC power source 71 may also be a high frequency AC source to reduce the size of transformer 72. Transformer 72 provides the electrical isolation to enable the secondary windings, common to the emitter of IGBT 20, to operate at a common mode voltage different from AC source 71. Rectifiers 73 and 74 steer current into capacitor 22 and rectifiers 75 and 76 steer current into capacitor 23 in a typical center-tapped bridge arrangement.

Figure 2:
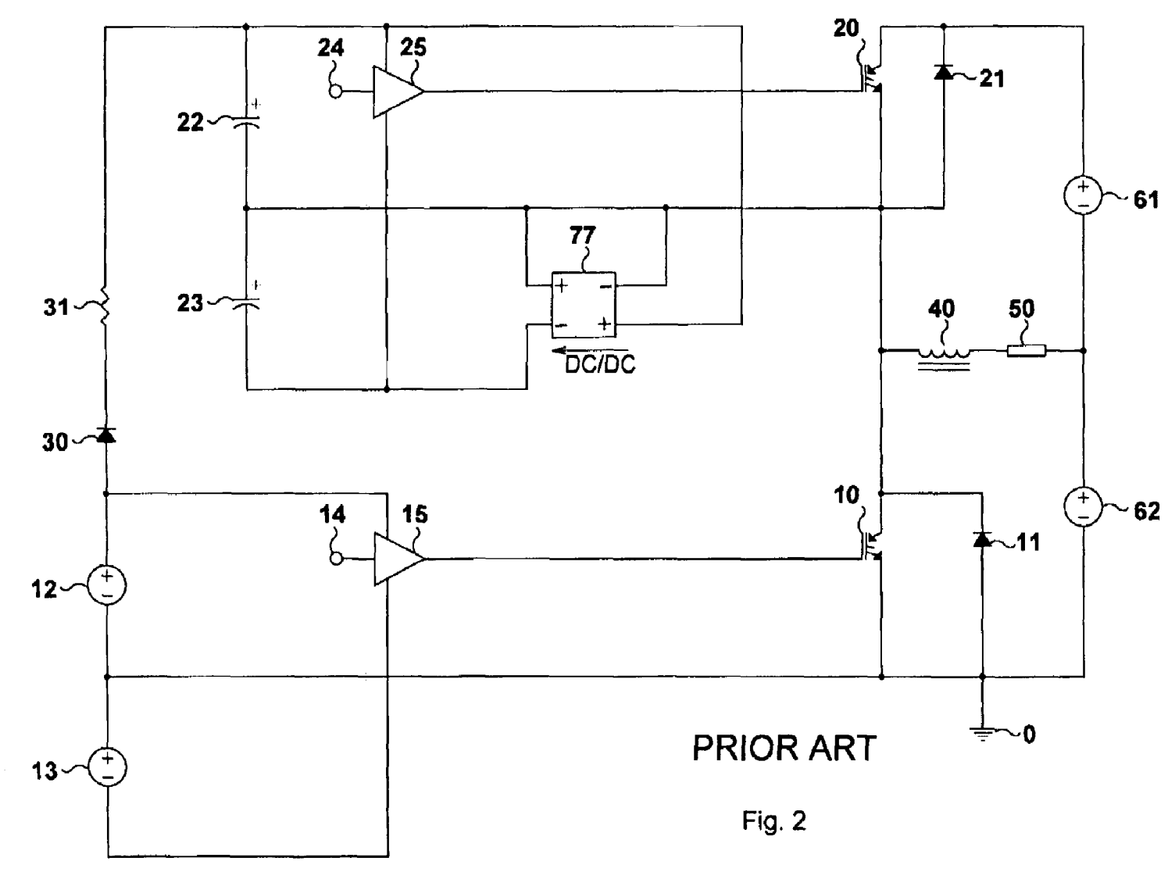
FIG. 2 illustrates a common, prior art method of providing bipolar drive supplies to a top or high-side switch using a bootstrap top switch positive supply and an inverting DC to DC converter that draws power from the top switch positive supply to provide the top switch negative gate drive potential.

FIG. 2 illustrates another common, prior art method of providing positive and negative drive voltage potentials to the top or high-side semiconductor switch in a half-bridge topology. The positive voltage for driver 25 and subsequently for IGBT 20, is provided by a known "bootstrap" circuit arrangement. When IGBT 10 is conducting, current is sourced from power supply 12, flows through bootstrap diode 30, into capacitor 22 and returns through IGBT 10. DC to DC converter 77 converts a portion of the energy stored in capacitor 22 into the negative voltage used by driver 25. This negative charge, with respect to the emitter of IGBT 20, is stored in capacitor 23. The topology of DC to DC converter 77 can vary. Common arrangements include flyback converters, charge pumps and transformer isolated topologies.

The invention claimed is:

1. A method, electrical circuit or apparatus for supplying both positive and negative gate drive power supplies to the "top" semiconductor switch, in a typical half-bridge semiconductor power topology, from the gate drive power supplies of the "bottom" switch and without the use of transformer, capacitive or optical isolation and where the half-bridge circuit topology is, only for the purpose of facilitating a concise description of the invention, defined as two insulated gate bipolar transistor (IGBT) switching devices each with antiparallel diodes and connected in series where the emitter of the "bottom" IGBT is connected to an arbitrary ground reference point, and where the collector of the bottom IGBT, the emitter of the top IGBT and one end of a filter inductor make a common connection and where the other end of said filter inductor is connected to one end of a load and where the other end of said load is connected to a positive DC power source with respect to said ground reference point and where the positive terminal of said positive DC power source is also connected to the negative terminal of a second DC power source having a positive terminal connected to the collector of said top IGBT and where the invention essentially comprises;

a bipolar arrangement of positive and negative power supplies with respect to the bottom IGBT emitter, a bottom gate driver circuit, capable of driving the gate of the bottom IGBT with respect to the bottom IGBT emitter, to turn the bottom IGBT "on" or "off", a top gate driver circuit, capable of driving the gate of the top IGBT positive or negative with respect to the top IGBT emitter, to turn the top IGBT "on" or "off", a bipolar arrangement of positive and negative energy storage capacitors, with respect to the emitter of the top IGBT, to supply power to said top gate driver circuit, a diode with anode connected to the positive terminal of said positive power supply referenced to the emitter of said bottom IGBT and with cathode connected to the positive terminal of said positive energy storage capacitor referenced to the emitter of said top IGBT, a third gate driver, which is substantially synchronized with said bottom gate driver circuit, a third switching device, a field effect transistor (FET), driven by said third gate driver and with source connected to the negative power supply terminal of said negative power supply referenced to the emitter of said bottom IGBT and with drain connected to the negative terminal of said negative energy storage capacitor referenced to the emitter of said top IGBT and where the switching action of the half-bridge IGBTs in substantially typical applications using substantially typical control methods plus the described inclusion and timing of said third switching device cause energy in said positive and negative power supplies referenced to the bottom IGBT emitter to be transferred to said positive and negative energy storage capacitors referenced to the emitter of the top IGBT, respectively.

2. A method, electrical circuit or apparatus according to claim 1 further comprising the addition of a diode connected with cathode to the drain terminal of said third switching device and with anode connected to the negative terminal of said negative energy storage capacitor referenced to the emitter of said top IGBT.

3. A method, electrical circuit or apparatus according to claims 1 or 2 where said third switching device, is brought into conduction when the emitter to collector voltage of said bottom IGBT is determined, by any known typical means, to be substantially less than the highest expected bottom IGBT saturation voltage or the highest expected voltage when the bottom IGBT is substantially in conduction.

4. A method, electrical circuit or apparatus according to claim 1 or 2 where said third switching device, is brought into conduction when sufficient current is sensed, by any known typical means, in a direction indicating that the bottom IGBT is in forward conduction.

5. A method, electrical circuit or apparatus according to claims 1 or 2 where said third switching device, is brought into conduction when the anode to cathode voltage of said anti-parallel diode associated with said bottom IGBT is determined, by any known typical means, to be substantially negative with respect to the emitter of said bottom IGBT, indicating that said anti-parallel diode is in conduction.

6. A method, electrical circuit or apparatus according to claims 1 or 2 where said third switching device, is brought into conduction when sufficient current is sensed, by any known typical means, in a direction indicating that the bottom IGBT anti-parallel diode is in forward conduction.

7. A method, electrical circuit or apparatus according to claims 1 or 2 where said third switching device is controlled by any means to substantially enable the transfer of energy from said negative power supply to said negative energy storage capacitor.

8. A circuit, power converter or motor drive comprising at least one bipolar voltage semiconductor drive circuit where the negative voltage potential used to power this drive circuit is derived from a second power source, at substantially disparate or varying common mode voltage potentials with respect to said bipolar voltage semiconductor drive circuit, and where said negative voltage potential is supplied from said second power source without the use of a transformer or inductor and without the use of transformer isolation, capacitive isolation or optical isolation between said second power source and said negative voltage potential.

9. A circuit, integrated circuit or circuit module intended, in part or whole, to function as part of a semiconductor drive circuit that substantially operates according to claim 7.

* * * * *